(12) United States Patent
Okada et al.

(10) Patent No.: US 9,966,952 B2
(45) Date of Patent: May 8, 2018

(54) SWITCH APPARATUS

(71) Applicant: SHIN-ETSU POLYMER CO., LTD., Tokyo (JP)

(72) Inventors: Noriaki Okada, Shiojiri (JP); Toshihiro Motoki, Shiojiri (JP)

(73) Assignee: Shin-Etsu Polymer Co., Ltd. (JP)

( * ) Notice: Subject to any disclaimer, the term of this patent is extended or adjusted under 35 U.S.C. 154(b) by 0 days. days.

(21) Appl. No.: 15/122,782

(22) PCT Filed: Mar. 4, 2015

(86) PCT No.: PCT/JP2015/001147
§ 371 (c)(1),
(2) Date: Aug. 31, 2016

(87) PCT Pub. No.: WO2015/133135
PCT Pub. Date: Sep. 11, 2015

(65) Prior Publication Data
US 2017/0070226 A1   Mar. 9, 2017

(30) Foreign Application Priority Data

Mar. 7, 2014 (JP) ................................. 2014-044681

(51) Int. Cl.
*H03K 17/975* (2006.01)
*H01H 13/702* (2006.01)

(52) U.S. Cl.
CPC ......... *H03K 17/975* (2013.01); *H01H 13/702* (2013.01); *H01H 2239/006* (2013.01)

(58) Field of Classification Search
CPC .. H01H 13/702; H01H 2239/006; H01H 9/00; H01H 9/02; H01H 9/04; H01H 9/16;
(Continued)

(56) References Cited

U.S. PATENT DOCUMENTS 4,852,443 A * 8/1989 Duncan ................ G10H 1/0551
200/600
7,126,498 B2   10/2006 Levy
(Continued)

FOREIGN PATENT DOCUMENTS

JP   2001-216070 A   8/2001
JP   2008-300247 A   12/2008
(Continued)

OTHER PUBLICATIONS

Extended European Search Report for EP Application No. 15758597.7, dated Nov. 7, 2017; 7 pages.

*Primary Examiner* — Anthony R. Jimenez
(74) *Attorney, Agent, or Firm* — Harness, Dickey & Pierce, P.L.C.

(57) ABSTRACT

A switch apparatus has a pressing section that is formed of a rubber-like elastic material and has a pressing region that is pressed in a predetermined pressing direction; and a capacitance sensor for detecting the pressing of the pressing region on the basis of capacitance. The capacitance sensor is positioned apart from the pressing section in the pressing direction, and is configured so that when the pressing region is not being pressed, a space (clearance) is maintained between the part (the lowermost surface of a protruding section of the pressing section on the side towards the capacitance sensor corresponding to the pressing region and another member (base housing disposed in the vicinity of the pressing region along the pressing direction, the space (clearance) allowing the part on the side towards the capacitance sensor to move in the pressing direction.

9 Claims, 10 Drawing Sheets

(58) Field of Classification Search
CPC .......... H01H 9/18; H01H 9/181; H01H 9/182;
H01H 13/00; H01H 13/02; H01H 13/50;
H01H 13/68; H01H 13/70; H01H
13/7006; H01H 2003/12; H01H 2009/16;
H01H 2009/164; H01H 2009/18; H01H
2009/182; H01H 2009/184; H01H
2009/186; H01H 2009/187; H01H
2219/014; H01H 2219/018; H01H
2219/036; H01H 2219/039; H03K
17/975; H03K 17/955; H03K 17/962;
H03K 17/9622; H03K 2017/9455; H03K
2217/96023; H03K 2217/96046; H03K
2217/960755; H03K 2217/960785; H03K
2217/96079
USPC ........................................................ 200/600
See application file for complete search history.

(56) References Cited

U.S. PATENT DOCUMENTS

| | | | |
|---|---|---|---|
| 7,893,374 B2* | 2/2011 | Aihara | H01H 13/83 |
| | | | 200/314 |
| 2008/0018611 A1 | 1/2008 | Serban et al. | |
| 2013/0068601 A1* | 3/2013 | Sellers | G06F 3/0202 |
| | | | 200/5 A |
| 2013/0299331 A1 | 11/2013 | Mittleman et al. | |

FOREIGN PATENT DOCUMENTS

| | | |
|---|---|---|
| JP | 2009-224112 A | 10/2009 |
| JP | 2010-277914 A | 12/2010 |
| JP | 2012-226894 A | 11/2012 |
| WO | WO-2008-052229 A2 | 5/2008 |
| WO | WO-2011-130755 A2 | 10/2011 |

* cited by examiner

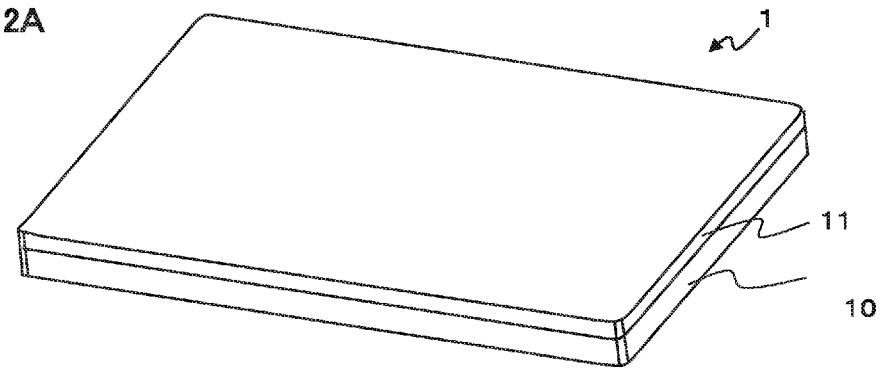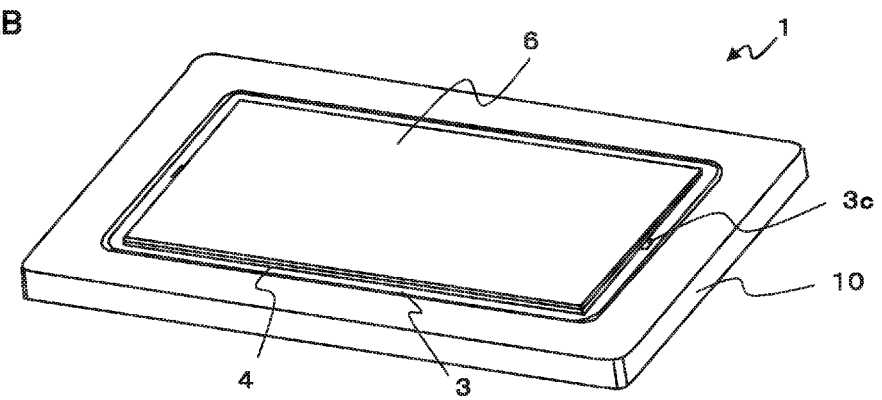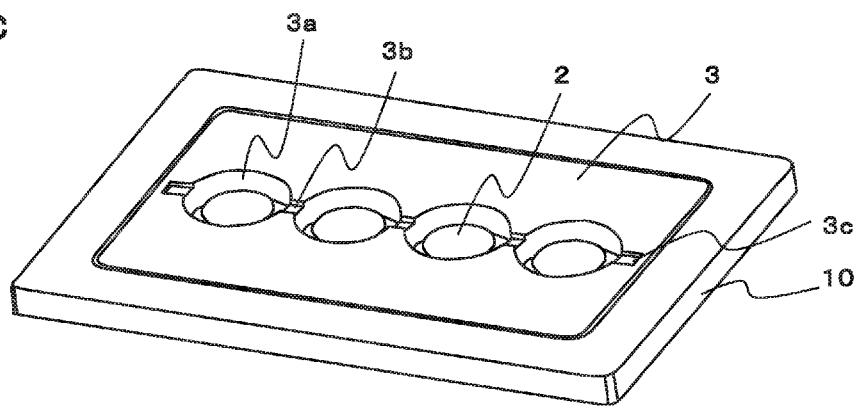

FIG. 7A

| Evaluation | | Number |
|---|---|---|
| A | Optimum | 16 or more |
| B | Favorable | 10 - 15 |
| C | Usable | 4 - 9 |
| D(NG) | Unusable | 3 or less |

FIG. 7B

| | Hardness - Displacement | Number | Evaluation |
|---|---|---|---|
| Comparative example 1 | 70-0mm | 1 | D(NG) |
| Comparative example 2 | 40-0mm | 0 | D(NG) |
| Example 1 | 40-0.3mm | 6 | C |
| Example 2 | 70-0.3mm | 4 | C |
| Example 3 | 40-0.5mm | 10 | B |
| Example 4 | 70-0.5mm | 6 | C |
| Example 5 | 40-1.0mm | 17 | A |
| Example 6 | 70-1.0mm | 22 | A |
| Example 7 | 40-1.5mm | 15 | B |
| Example 8 | 70-1.5mm | 8 | C |
| Example 9 | 40-2.0mm | 4 | C |
| Number | | 93 | |

SWITCH APPARATUS

CROSS REFERENCE TO RELATED APPLICATIONS

This application is a U.S. National Stage Application of International Application No. PCT/JP2015/001147, filed on Mar. 4, 2015, and published in Japanese as WO 2015/133135 A1 on Sep. 11, 2015. This application is based upon and claims the benefit of priority of Japanese Patent Application No. 2014-044681 filed in the Japan Patent Office on Mar. 7, 2014. The entire contents of both the above applications are incorporated herein by reference. Furthermore, the entire contents of all patents, published patent applications, and other references cited in this application herein are incorporated herein by reference.

TECHNICAL FIELD

The present invention relates to a switch apparatus that detects pressing operation performed on a pressing region in a pressing direction.

BACKGROUND ART

In related art, a switch apparatus that mechanically performs on-off operation of an electronic apparatus is well known. Also, an electrostatic capacitance switch apparatus that detects variation of an electrostatic capacitance caused by touching or pressing of a pressing region to perform switch operation such as on-off operation is well known.

In recent years, such an electrostatic capacitance switch apparatus may be mounted on an automobile and the like. Even when an operator driving the automobile touches the pressing region of the switch apparatus, it is difficult for the operator to realize whether the switch apparatus is surely operated.

In contrast, a switch apparatus is known in which sound or vibration is generated to allow the operator to realize that the operation is effective, in order to allow the operator to realize that the operation is performed. Also, a technology relating to a switch that allows the operator to realize feeling of pressing the switch is also disclosed (for example, refer to Japanese Patent Laid-Open No. 2008-300247).

For example, the technology disclosed in Japanese Patent Laid-Open No. 2008-300247 allows the operator to realize the feeling of pressing the switch. However, it is desirable to cause the operator to realize the feeling of pressing the switch more effectively.

The present invention is made in consideration of the above-described problem, and it is an object of the present invention to provide a technology that allows the operator to realize pressing of the pressing region more effectively.

SUMMARY OF THE INVENTION

To achieve the above-described object, a switch apparatus according to an embodiment of the present invention includes: a pressing section that includes pressing regions and is formed of a rubber-like elastic body, each of the pressing regions receiving pressing in a pressing direction; and an electrostatic capacitance sensor that detects the pressing in the pressing region based on an electrostatic capacitance, in which the electrostatic capacitance sensor is disposed with a distance from the pressing section in the pressing direction, and a space in which a part of pressing section corresponding to the pressing region on a side close to the electrostatic capacitance sensor is movable in the pressing direction is secured between the part of the pressing section on the side close to the electrostatic capacitance sensor and other member that is disposed just near the pressing region of the pressing section in the pressing direction, in a state in which the pressing region is not pressed.

In a switch apparatus according to another embodiment, further, a protrusion that protrudes toward the electrostatic capacitance sensor is provided on the pressing section corresponding to the pressing region on the side close to the electrostatic capacitance sensor.

A switch apparatus according to still another embodiment further includes a housing for attaching the pressing section thereto, and the housing parts the pressing section and the electrostatic capacitance sensor.

In a switch apparatus according to still another embodiment, further, the pressing section is fixed to the housing through an insert molding method.

In a switch apparatus according to still another embodiment, further, the housing is disposed just near the pressing region of the pressing section in the pressing direction.

In a switch apparatus according to still another embodiment, further, a distance of the space in the pressing direction in which the part of the pressing section on the side close to the electrostatic capacitance sensor is movable in the pressing direction is 0.3 mm or more.

In a switch apparatus according to still another embodiment, further, the pressing region of the pressing section has a stepped part.

In a switch apparatus according to still another embodiment, further, the pressing section has hardness of 25 or more and 70 or less that is measured by a type A durometer in accordance with a measurement method of JIS K 6253.

In a switch apparatus according to still another embodiment, further, a displacement at a contact point is within a range of 0.5 mm or more and less than 1.8 mm, and load at the contact point is 7 N or less.

In a switch apparatus according to still another embodiment, further, the displacement at the contact point is within a range of 0.8 mm or more and less than 1.5 mm, and the load at the contact point is 7 N or less.

In a switch apparatus according to still another embodiment, further, the rubber-like elastic body is a silicone rubber.

ADVANTAGEOUS EFFECTS OF INVENTION

According to the present invention, it is possible to allow an operator to realize pressing of a pressing region more effectively.

BRIEF DESCRIPTION OF THE DRAWINGS

FIGS. 2A-2C are a back surface perspective view and exploded perspective views of the switch apparatus according to the first embodiment of the present invention.

FIGS. 7A and 7B are diagrams illustrating results of sensory evaluation by operators when the operators perform pressing operation on the switch apparatus according to each of Examples of the present invention and the comparative examples.

DESCRIPTION OF EMBODIMENTS

Some example embodiments of the present invention are described with reference to drawings. Note that example embodiments described below are not intended to limit the invention set forth in the appended claims. Also, all of components and combinations thereof described in the example embodiments are not necessarily essential for solution of the invention.

First Embodiment

First, a switch apparatus according to a first embodiment of the present invention is described.

Figure 1A:
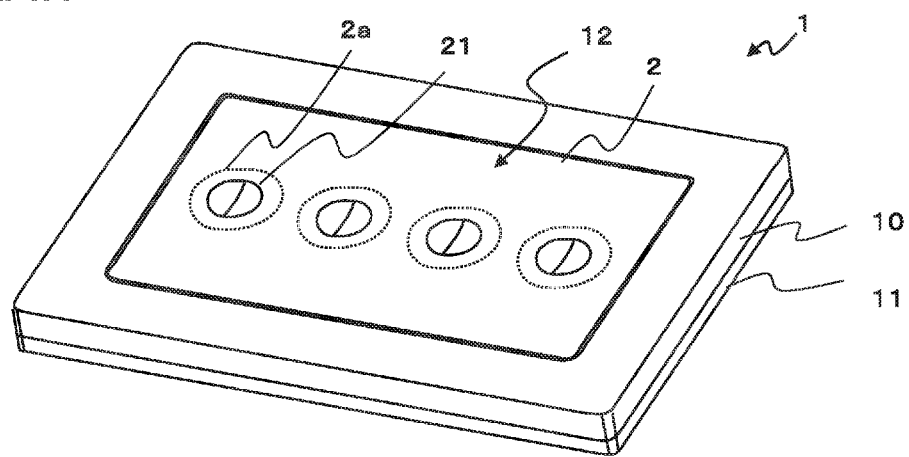
FIGS. 1A and 1B are a perspective view and a top view of a switch apparatus according to a first embodiment of the present invention.
Figure 1B:
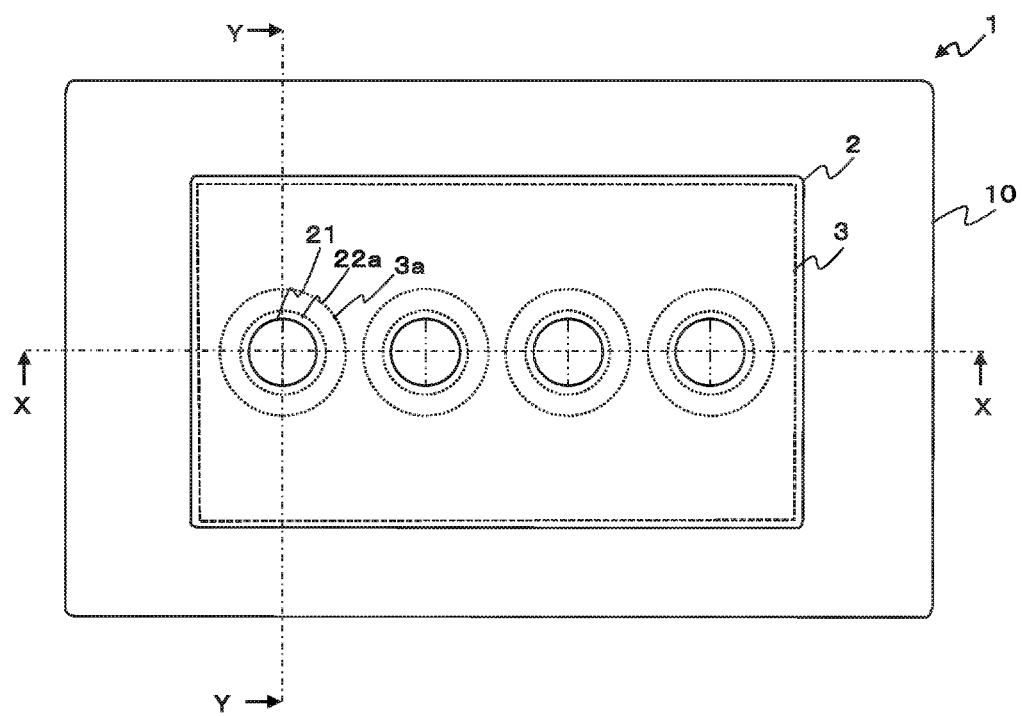
Figure 3A:
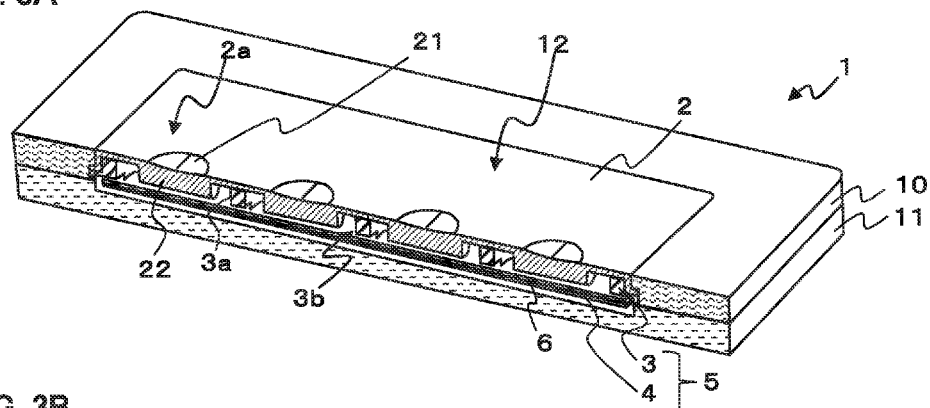
FIGS. 3A-3C are a cross-sectional perspective view and cross-sectional views of the switch apparatus according to the first embodiment of the present invention.
Figure 3B:
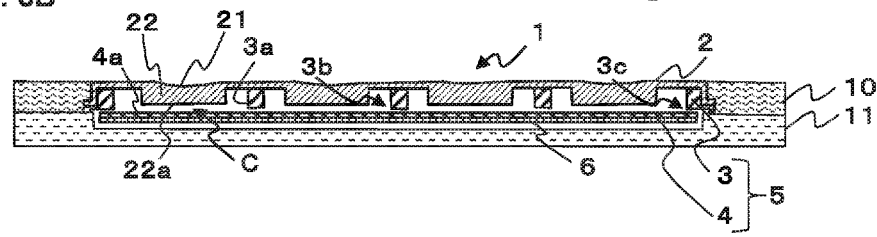
Figure 3C:
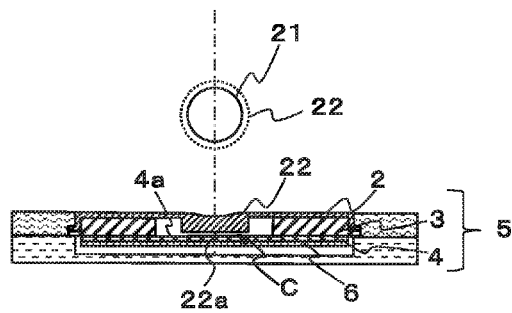

FIG. 1 is a perspective view and a top view of the switch apparatus according to the first embodiment of the present invention. FIG. 2 is a back surface perspective view and exploded perspective views of the switch apparatus according to the first embodiment of the present invention. FIG. 3 is a cross-sectional perspective view and cross-sectional views of the switch apparatus according to the first embodiment of the present invention. FIG. (1A) is a perspective view of the switch apparatus, and FIG. (1B) is a top view of the switch apparatus. FIG. (2A) is a back surface perspective view of the switch apparatus, FIG. (2B) is a perspective view of the back surface in a state where a lower case of the switch apparatus is removed, and FIG. (2C) is a perspective view of the back surface in a state where the lower case, an electrostatic capacitance sensor, and a base housing of the switch apparatus are removed. FIG. (3A) is a cross-sectional perspective view taken along line X-X in FIG. (1B), FIG. (3B) is a cross-sectional view taken along the line X-X in FIG. (1B), and FIG. (3C) is a cross-sectional view taken along line Y-Y in FIG. (1B) and a partial top view.

The switch apparatus 1 may be, for example, a switch apparatus to be mounted on an automobile. As illustrated in FIG. (1A), the switch apparatus 1 is a switch apparatus that detects, in one or more (four, in the figure) pressing regions 2a, pressing operation in a predetermined pressing direction (in a direction from top to down in the figure: hereinafter, also referred to as a downward direction) performed by an operator. The switch apparatus 1 includes a switch function section 12, and an upper case 10 and a lower case 11 that house the switch function section 12. As illustrated in FIG. (1A) and FIG. (2A), the upper case 10 and the lower case 11 are configured to expose only an operation surface of a pressing section 2 of the switch function section 12 to the outside, and to fully house therein the other parts of the switch function section 12. As illustrated in FIG. (3A), FIG. (3B), and FIG. (3C), the switch function section 12 of the switch apparatus 1 includes the pressing section 2, a housing 5 (an upper housing 3 and a base housing 4), and an electrostatic capacitance sensor 6 in order from a side close to a top surface that is to be pressed by the operator.

The pressing section 2 may be formed of, for example, a rubber-like elastic body. Examples of the rubber-like elastic body may include: thermosetting elastomer such as a silicone rubber, a urethane rubber, an isoprene rubber, an ethylene-propylene rubber, a natural rubber, an ethylene-propylene-diene rubber, and a styrene-butadiene rubber; a urethane-based, ester-based, styrene-based, olefin-based, butadiene-based, and fluorine-based thermoplastic elastomer; and a composite thereof. The silicone rubber is suitable. The hardness of the rubber-like elastic body forming the pressing section 2 (hardness measured by a type A durometer in accordance with the measurement method of JIS K 6253: referred to as type A hardness) may be, for example, 25 or more and 70 or less, and more preferably 30 or more and 50 or less. This is because durability for repeated use is impaired when the type A hardness is lower than 25, and favorable feeling is not obtainable when the type A hardness is higher than 70.

A recess 21 is provided at a substantially center of each pressing region 2a of the pressing section 2. The recess 21 is an example of a stepped part, and for example, is a depression that is depressed in the pressing direction and has a circular top surface with a diameter of 8 mm. The recess 21 allows the operator to realize the recess 21 easily and appropriately through touch to the surface of the pressing section 2 without the need for the operator to view the recess 21. As a result, the operator can easily realize the pressing region 2a. In this case, the stepped part is not limited to the recess 21 and may be a protrusion protruding in a direction opposite to the pressing direction. In other words, it is sufficient for the pressing region 2a to include a step extending in the pressing direction. The protrusion forming the stepped part may be a columnar part having a relatively large diameter (for example, 8 mm), may be formed of a plurality of columnar parts each having a relatively small diameter, or may be a cylindrical part. Note that the recess 21 is suitable as the stepped part that allows the operator to easily realize the pressing region 2a.

Also, as illustrated in FIG. (3A), FIG. (3B), and FIG. (3C), a protrusion 22 protruding in the pressing direction is provided in a region corresponding to the pressing region 2a of the pressing section 2 in the pressing direction. In the present embodiment, the protrusion 22 is a columnar part that has a diameter larger than the diameter of the recess 21. For example, the protrusion 22 may have a diameter of 10 mm and a thickness in the pressing direction of 3.55 mm. Note that a thin part of the pressing section 2 may have a thickness of, for example, 0.75 mm.

The pressing section 2 is fixed to the upper housing 3 of the housing 5. The upper housing 3 may be formed of, for example, a rigid resin member having high insulation property, and suitably formed of a polycarbonate (PC), a polymethylmethacrylate (PMMA), polybutylene terephthalate (PBT), or a copolymer of PC and PBT. As illustrated in FIG. (2C), FIG. (3A), and FIG. (3B), the upper housing 3 includes, in regions opposed to the respective pressing regions 2a of the pressing section 2, recesses 3a that each house the protrusion 22. As illustrated in FIG. (1B), each recess 3a has a diameter (for example, 15 mm) larger than the diameter of the protrusion 22. Also, as illustrated in FIG.

(2C), FIG. (3A), and FIG. (3C), the upper housing 3 includes a groove 3b and a groove 3c. The groove 3b establishes communication between the recesses 3a, and the groove 3c extends from the recess 3a to outer circumference side. As illustrated in FIG. (2B), the groove 3c extends to outside of the outer circumference of the base housing 4 and the electrostatic capacitance sensor 6. Therefore, as illustrated in FIG. (3A), FIG. (3B), each of the recesses 3a is communicated with a space between the lower case 11 and both the base housing 4 and the electrostatic capacitance sensor 6. Note that the space between the lower case 11 and both the base housing 4 and the electrostatic capacitance sensor 6 is not communicated with the outside, which appropriately prevents dust and water from entering the space from the outside. In addition, the space of each recess 3a is communicated with the space of the other recess 3a and is communicated with the space between the lower case 11 and both the base housing 4 and the electrostatic capacitance sensor 6, thereby forming a space having a relatively large volume as a whole, as mentioned above. This makes it possible to effectively suppress increase in load to the pressing that is caused by compression of the air in the recess 3a when the operator presses down the pressing section 2.

To fix the pressing section 2 to the upper housing 3, for example, an insert molding method may be used in which the upper housing 3 is set in a predetermined mold, a uncured rubber material of the pressing section 2 is cast in the mold, and the pressing section 2 is integrally formed with the upper housing 3.

The base housing 4 is fixed to a bottom of the upper housing 3. The base housing 4 is a substantially planar member, and covers an entire bottom surface of the recess 3a of the upper housing 3. The base housing 4 may be formed of, for example, a rigid resin member having high insulation property, and is suitably formed of polycarbonate (PC), or polymethylmethacrylate (PMMA). The base housing 4 may have a thickness of, for example, 0.5 mm. The recess 3a side and the lower side of the base housing 4 are parted by the base housing 4 with such a configuration. Thus, the base housing 4 prevents static electricity caused by the pressing section 2 from being transferred to the electrostatic capacitance sensor 6. This makes it possible to prevent breakage of the electrostatic capacitance sensor 6 due to the static electricity.

As illustrated in FIG. (3B), in the present embodiment, the base housing 4 is a member disposed just near the pressing region 2a of the pressing section 2 in the pressing direction.

As illustrated in FIG. (3B), a space (a clearance) C in which a part of the pressing section 2 on the electrostatic capacitance sensor side (the protrusion 22) is movable in the pressing direction is provided between a lowermost surface 22a of the protrusion 22 of the pressing section 2 and the upper surface 4a of the base housing 4. A predetermined distance or more is secured as the clearance C in the pressing direction when the pressing operation is not performed on the pressing region 2a of the pressing section 2. The distance of the clearance C in the pressing direction may be, for example, 0.3 mm or more, and more preferably 0.5 mm or more. When the pressing operation is performed on the pressing region 2a of the pressing section 2, the lowermost surface 22a of the protrusion 22 is first brought into contact with the upper surface 4a of the base housing 4. When the pressing operation is further performed, the protrusion 22 deforms. As mentioned above, the clearance C is secured between the lowermost surface 22a of the protrusion 22 of the pressing section 2 and the upper surface 4a of the base housing 4. Thus, when the pressing region 2a of the pressing section 2 is pressed down, the vicinity of the pressing region 2a of the pressing section 2 is relatively easily deflected. This allows a finger of the operator or the like that has pressed the pressing region 2a to relatively easily move in the pressing direction. Thus, the operator can easily and surely realize that the operator operates the switch apparatus. Also, the protrusion 22 easily deforms with a certain degree of repulsive force after the lowermost surface 22a of the protrusion 22 is brought into contact with the upper surface 4a of the base housing 4, which allows the finger of the operator or the like to further move in the pressing direction. Therefore, the operator more effectively realizes the pressing operation. Note that the force applied to the protrusion 22 is received by the base housing 4 that is a rigid resin member, which prevents unnecessary force from being applied to the electrostatic capacitance sensor 6 that is disposed under the base housing 4. Accordingly, it is possible to appropriately prevent the electrostatic capacitance sensor 6 from being compressed and deflected.

The electrostatic capacitance sensor 6 that detects an electrostatic capacitance of the pressing region 2a is disposed under the base housing 4.

Figure 4A:
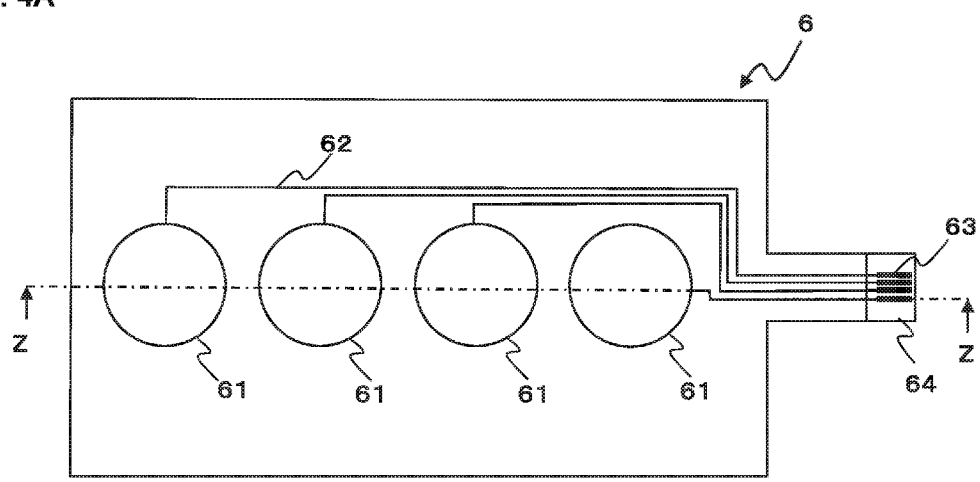
FIGS. 4A and 4B are diagrams illustrating a structure of an electrostatic capacitance sensor according to the first embodiment of the present invention.
Figure 4B:
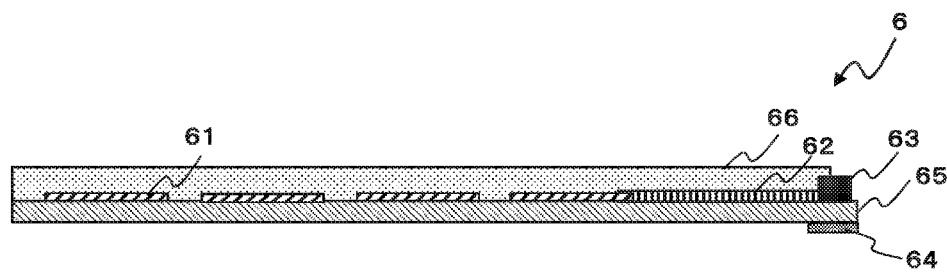

FIG. 4 is a diagram illustrating a structure of the electrostatic capacitance sensor according to the first embodiment of the present invention. FIG. (4A) is a top view of the electrostatic capacitance sensor, and FIG. (4B) is a cross-sectional view taken along line Z-Z in FIG. (4A).

The electrostatic capacitance sensor 6 is a sensor to detect an electrostatic capacitance, and may be of a self-capacitance type or a mutual-capacitance type. As illustrated in FIG. (4A), the electrostatic capacitance sensor 6 includes: detection electrodes 61 that are disposed at respective positions opposed to the corresponding pressing regions 2a; wirings 62 connected to the respective detection electrodes 61; a terminal section 63 that is connected to the wiring 62 and connects the electrostatic capacitance sensor 6 with an external apparatus; and a stiffener (a reinforcing member) 64. Each of the detection electrodes 61 may be formed of a thin film of a metal such as copper and silver, or may be formed of an electroconductive polymer film such as transparent PEDOT/PSS, a film made of a nano microfiber of a material such as copper, silver, and carbon, or an indium tin oxide (ITO) film. Note that, in the present embodiment, each of the detection electrodes 61 is a transparent electrode.

As illustrated in FIG. (4B), the electrostatic capacitance sensor 6 has the detection electrodes 61 formed on a base material 65, and the detection electrodes 61 are connected to the terminal section 63 through the respective wirings 62. A protective layer 66 that protects the detection electrodes 61 is provided on the detection electrodes 61. The protective layer 66 may be formed of an adhesive material. The stiffener 64 is provided under the base material 65 provided with the terminal section 63.

Next, Examples (Example 1 to Example 13) are described in which, in the first embodiment, the shape of the pressing section 2 is identical, and the hardness of the rubber-like elastic body forming the pressing section 2 and the clearance between the lowermost surface 22a of the protrusion 22 of the pressing section 2 and the member disposed just near the pressing region 2a of the pressing section 2 (more specifically, the protrusion 22) in the pressing direction are varied. In addition, comparative examples (a comparative example 1 and a comparative examples 2) are described in which the pressing section 2 having the identical shape is used and the clearance between the lowermost surface 22a of the protrusion 22 of the pressing section 2 and the member disposed just near the pressing region 2a in the pressing direction is eliminated.

The comparative example 1 is an example in which the pressing section 2 has the type A hardness of 70 and the clearance is eliminated. The comparative example 2 is an example in which the pressing section 2 has the type A hardness of 40 and the clearance is eliminated.

Example 1 is an example in which the pressing section 2 has the type A hardness of 40 and the distance of the clearance in the pressing direction is set to 0.3 mm. Example 2 is an example in which the pressing section 2 has the type A hardness of 70 and the distance of the clearance in the pressing direction is set to 0.3 mm. Example 3 is an example in which the pressing section 2 has the type A hardness of 40 and the distance of the clearance in the pressing direction is set to 0.5 mm. Example 4 is an example in which the pressing section 2 has the type A hardness of 70 and the distance of the clearance in the pressing direction is set to 0.5 mm. Example 5 is an example in which the pressing section 2 has the type A hardness of 40 and the distance of the clearance in the pressing direction is set to 1.0 mm. Example 6 is an example in which the pressing section 2 has the type A hardness of 70 and the distance of the clearance in the pressing direction is set to 1.0 mm. Example 7 is an example in which the pressing section 2 has the type A hardness of 40 and the distance of the clearance in the pressing direction is set to 1.5 mm. Example 8 is an example in which the pressing section 2 has the type A hardness of 70 and the distance of the clearance in the pressing direction is set to 1.5 mm. Example 9 is an example in which the pressing section 2 has the type A hardness of 40 and the distance of the clearance in the pressing direction is set to 2.0 mm. Example 10 is an example in which the pressing section 2 has the type A hardness of 40 and the distance of the clearance in the pressing direction is set to 0.75 mm. Example 11 is an example in which the pressing section 2 has the type A hardness of 70 and the distance of the clearance in the pressing direction is set to 0.75 mm. Example 12 is an example in which the pressing section 2 has the type A hardness of 40 and the distance of the clearance in the pressing direction is set to 1.25 mm. Example 13 is an example in which the pressing section 2 has the type A hardness of 70 and the distance of the clearance in the pressing direction is set to 1.25 mm.

Figure 5:
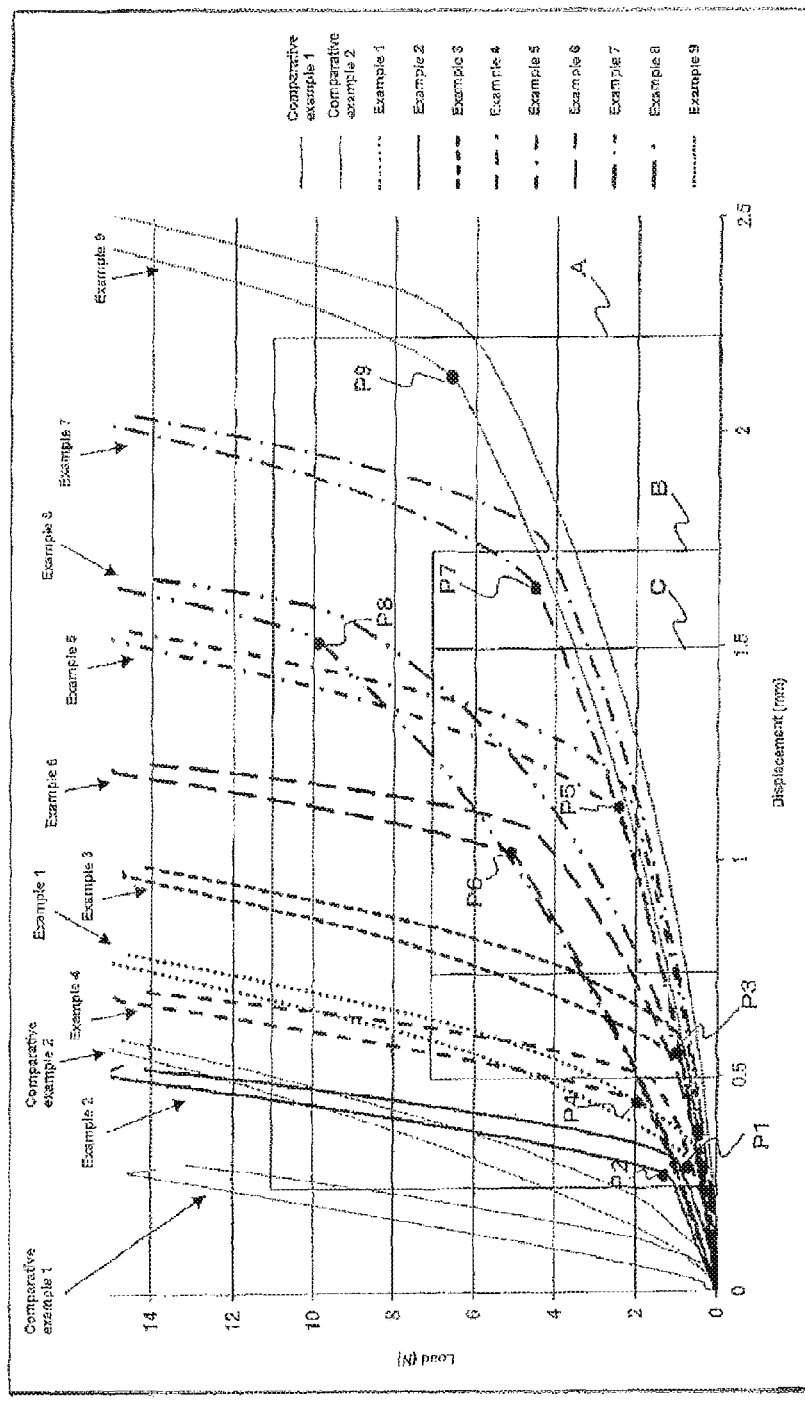
FIG. 5 is a diagram illustrating relationship between displacement and a road when a pressing region is pressed down in a switch apparatus according to each of Examples 1 to 9 of the present invention and comparative examples.
Figure 6:
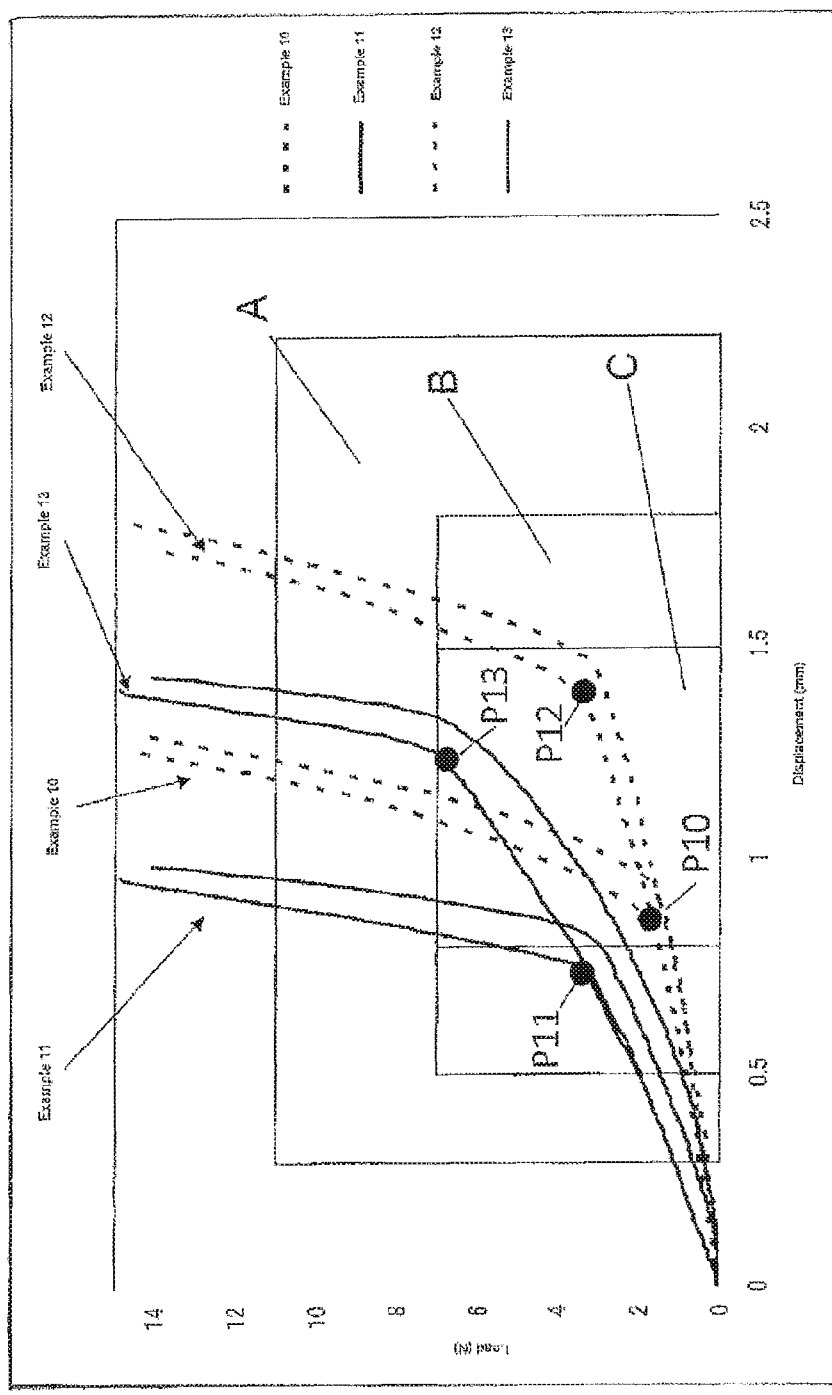
FIG. 6 is a diagram illustrating relationship between displacement and a load when a pressing region is pressed down in a switch apparatus according to each of Examples 10 to 13 of the present invention.

FIG. 5 is a diagram illustrating relationship between displacement and load when the pressing region is pressed down in the switch apparatus according to each of Examples 1 to 9 of the present invention and the comparative examples. FIG. 6 is a diagram illustrating relationship between displacement and load when the pressing region is pressed down in the switch apparatus according to each of Examples 10 to 13 of the present invention. FIG. 5 and FIG. 6 each illustrate relationship between displacement (mm) of a columnar jig and load (N) when the top surface of the recess 21 of the pressing region 2a of the pressing section 2 is pressed by the columnar jig at a velocity of 1.0 mm/sec and when the pressing is released (in recovery). The columnar jig has a diameter of 8 mm. Note that a left line corresponding to each example illustrates the relationship in a pressed state, and a right line illustrates relationship in a released state. Also, points P1 to P9 in FIG. 5 and P10 to P13 in FIG. 6 indicate points at which increasing tendency of the load to the displacement is largely varied in respective Examples 1 to 13. More specifically, the points P1 to P13 each indicate a point (a contact point) at which the pressing region 2a of the pressing section 2 is brought into contact with a member disposed just near the pressing region 2a.

FIG. 7 is diagrams illustrating results of sensory evaluation by operators when the operators perform pressing operation on the switch apparatus according to each of Examples of the present invention and the comparative examples. FIG. (7A) illustrates an evaluation criteria of the sensory evaluation, and FIG. (7B) illustrates results of the sensory evaluation that is performed on the switch apparatus according to each of Examples 1 to 9 and the comparative examples 1 and 2.

In the sensory evaluation, 31 operators performed the pressing operation on each switch apparatus to be evaluated, and each operator selected top three switch apparatuses having favorable pressing feeling.

As illustrated in FIG. (7A), in the sensory evaluation, the switch apparatus that was selected as the favorable switch apparatus by 16 or more operators out of a total of 31 operators was evaluated to A (optimum). The switch apparatus that was selected by 10 or more and 15 or less operators was evaluated to B (favorable). The switch apparatus that was selected by 4 or more and 9 or less operators was evaluated to C (usable). The switch apparatus that was selected by three or less operators was evaluated to D (NG, unusable).

As a result of the sensory evaluation that was performed on the switch apparatuses according to Examples 1 to 9 and the comparative examples 1 and 2, the numbers of operators that select the respective switch apparatuses as a favorable switch apparatus are as illustrated in FIG. (7B). The respective switch apparatuses according to Example 1, Example 2, Example 4, Example 8, and Example 9 were evaluated to C (usable). The respective switch apparatuses according to Example 3 and Example 7 were evaluated to B (favorable). The respective switch apparatuses according to Example 5 and Example 6 were evaluated to A (optimum).

In the comparative example 1 and the comparative example 2, the displacement was equal to or lower than 0.5 mm, which was small even when the load was 5 N or more. The evaluation of pressing feeling by the plurality of operators was totaled with use of the respective switch apparatuses of the comparative example 1 and the comparative example 2. As a result, the switch apparatuses received an evaluation that feeling of pressing the pressing region is hard and pressing feeling is not obtainable.

In the switch apparatus in Example 1, displacement was 0.3 mm or more even when the load is relatively small, about 2 N, and the displacement further increased when the load was larger. In the switch apparatus in Example 2, the displacement was 0.3 mm or more when the load was relatively small, about 2 N, and the displacement further increased when the load was larger.

In the switch apparatus in Example 1, the displacement was larger than that of the switch apparatus in Example 2 when the load was the same. The evaluation of pressing feeling by the plurality of operators was totaled. As a result, the respective switch apparatuses in Example 1 and Example 2 received an evaluation that pressing feeling was higher than the pressing feeling of the respective switch apparatuses in the comparative example 1 and the comparative example 2, and the feeling was favorable. In addition, the switch apparatus in Example 1 received an evaluation that the pressing feeling was better than that of the switch apparatus in Example 2.

In the switch apparatus in Example 3, the displacement was 0.5 mm or more even when the load was relatively small, about 2 N, and the displacement further increased when the load was larger. In the switch apparatus in Example 4, the displacement was 0.4 mm or more even when the load was relatively small, about 2 N, and the displacement further increased when the load was larger.

In the switch apparatus in Example 3, the displacement was larger than that of the switch apparatus in Example 4 when load was the same. The evaluation of pressing feeling by the plurality of operators was totaled. As a result, the respective switch apparatuses in Example 3 and Example 4 received an evaluation that pressing feeling was higher than the pressing feeling of the switch apparatuses in Example 1 and Example 2, and the feeling was favorable. Also, the switch apparatus in Example 3 received a lot of evaluation that the pressing feeling was better than that of the switch apparatus in Example 4.

In the switch apparatus in Example 5, the displacement was 1.0 mm or more even when load was relatively small, about 2 N, and the displacement further increased when the load was larger. Also, in the switch apparatus in Example 5, the displacement was larger than that of the switch apparatus in Example 3 when the load was the same and was larger than 0.9 N. The evaluation of pressing feeling by the plurality of operators was totaled. As a result, the switch apparatus in Example 5 received a lot of evaluation that the pressing feeling was high and had repulsive force, and operational feeling was also high as compared with the switch apparatuses in Example 3 and Example 4.

In the switch apparatus in Example 6, the displacement was 0.5 mm or more even when the load was relatively small, about 2 N, and the displacement further increased when the load was larger. Also, in the switch apparatus in Example 6, the displacement was larger than that of the switch apparatus in Example 4 when the load was the same and was larger than 1.6 N. The evaluation of pressing feeling by the plurality of operators was totaled. As a result, the switch apparatus in Example 6 received a lot of evaluation that the pressing feeling was higher than the pressing feeling of the respective switch apparatuses in Example 3, Example 4, Example 5, and Example 8 described later and the feeling was favorable.

In the switch apparatus in Example 7, the displacement was 1.0 mm or more even when the load was relatively small, about 2 N, and the displacement further increased when the load was larger. Also, in the switch apparatus in Example 7, the displacement was larger than that of the switch apparatus in Example 3 when the load was the same and was larger than 0.9 N. In Example 7, since the displacement amount to the load was varied substantially linearly to 1.7 mm, favorable feeling was obtained. The evaluation of pressing feeling by the plurality of operators was totaled. As a result, the switch apparatus in Example 7 received a lot of evaluation that the pressing feeling was high and had repulsive force, and operational feeling was also high as compared with the respective switch apparatuses in the comparative example 1, the comparative example 2, and Example 1.

In the switch apparatus in Example 8, the displacement was 0.5 mm or more even when the load was relatively small, about 2 N, and the displacement further increased when the load was larger. Also, in the switch apparatus in Example 8, the displacement was larger than that of the switch apparatus in Example 4 when the load was the same and was larger than 1.6 N. The evaluation of pressing feeling by the plurality of operators was totaled. As a result, the switch apparatus in Example 8 received a lot of evaluation that the pressing feeling was higher than the pressing feeling of the respective switch apparatuses in the comparative example 1, the comparative example 2, and Example 2 and the feeling was favorable.

In the switch apparatus in Example 9, the displacement was 1.0 mm or more even when the load was relatively small, about 2 N, and the displacement further increased when the load was larger. The evaluation of pressing feeling by the plurality of operators was totaled. As a result, the switch apparatus in Example 9 received an evaluation that the pressing feeling was higher than the pressing feeling of the respective switch apparatuses in the comparative example 1 and the comparative example 2 and the feeling was favorable.

As for the switch apparatuses in Examples 10 to 13, the following evaluation was obtained from the results of the displacement-load curved lines in FIG. 6, although the sensory evaluation was not accurate statistically as compared with the comparative examples 1 and 2 and Examples 1 to 9. In the switch apparatus in Example 10, the displacement was 0.5 mm or more even when the load was relatively small, about 2 N, and the displacement further increased when the load was larger. Also, in the switch apparatus in Example 10, since the displacement amount to the load was varied substantially linearly to 0.8 mm, favorable feeling was obtained. The evaluation of pressing feeling by the plurality of operators was totaled. As a result, the switch apparatus in Example 10 received a lot of evaluation that the pressing feeling was higher than the pressing feeling of the respective switch apparatuses in Examples 1 to 4, Examples 7 to 9, and Example 11 described later and the feeling was favorable.

In the switch apparatus in Example 11, the displacement was 0.5 mm or more even when the load was relatively small, about 2 N, and the displacement further increased when the load was larger. Also, in the switch apparatus in Example 11, since the displacement amount to the load was varied substantially linearly to 0.7 mm, favorable feeling was obtained. The evaluation of pressing feeling by the plurality of operators was totaled. As a result, the switch apparatus in Example 11 received a lot of evaluation that the pressing feeling was higher than the pressing feeling of the respective switch apparatuses in Examples 1 to 4, Example 8, and Example 9 and the feeling was favorable.

In the switch apparatus in Example 12, the displacement was 1.0 mm or more even when the load was relatively small, about 2 N, and the displacement further increased when the load was larger. Also, in the switch apparatus in Example 12, since the displacement amount to the load was varied substantially linearly to 1.4 mm, favorable feeling was obtained. The evaluation of pressing feeling by the plurality of operators was totaled. As a result, the switch apparatus in Example 12 received a lot of evaluation that the pressing feeling was higher than the pressing feeling of the respective switch apparatuses in Examples 1 to 4, Examples 7 to 9, and Example 11 and the feeling was favorable.

In the switch apparatus in Example 13, the displacement was 0.5 mm or more even when the load was relatively small, about 2 N, and the displacement further increased when the load was larger. Also, in the switch apparatus in Example 13, since the displacement amount to the load was varied substantially linearly to 1.2 mm, favorable feeling was obtained. The evaluation of pressing feeling by the plurality of operators was totaled. As a result, the switch apparatus in Example 13 received a lot of evaluation that the pressing feeling was higher than the pressing feeling of the respective switch apparatuses in Examples 1 to 4, Examples 7 to 9, and Example 11 and the feeling was favorable.

It is understood from the above-described results that the pressing feeling is insufficient when the distance of the clearance in the pressing direction is less than 0.3 mm, and the distance of the clearance in the pressing direction is preferably 0.3 mm or more. Also, assuming a switch apparatus for an automobile electronic apparatus, if the distance of the clearance in the pressing direction exceeds 2.2 mm, the stroke of the switch apparatus exceeds stroke of an existing mechanical switch apparatus, which deteriorates the pressing feeling of the operator and inhibits thickness reduction of the switch apparatus. Thus, the distance of the clearance in the pressing direction may be preferably 2.2 mm or less. Further, based on the feeling evaluation of the operators, the contact point of the switch apparatus may be preferably within a region A in FIG. 5 and FIG. 6, namely, the displacement amount at the contact point may be preferably within a range of 0.3 mm or more and 2.2 mm or less, and the load at the contact point may be preferably 11 N or less. Furthermore, the contact point of the switch apparatus may be more preferably within a region B in FIG. 5 and FIG. 6, namely, the displacement amount at the contact point may be more preferably within a range of 0.5 mm or more and less than 1.8 mm, and the load at the contact point may be more preferably 7 N or less. Also, since the respective switch apparatuses in Example 5, Example 6, Example 10, Example 12, and Example 13 are evaluated to be optimum, the contact point of the switch apparatus may be most preferably within a region C in FIG. 5 and FIG. 6, namely, the displacement amount at the contact point may be most preferably within a range of 0.8 mm or more and less than 1.5 mm, and the load at the contact point may be most preferably 7 N or less.

Second Embodiment

Next, a switch apparatus according to a second embodiment of the present invention is described. In the present embodiment, the components common to those in the first embodiment are denoted by the same reference numerals, and description thereof is appropriately omitted.

Figure 8A:
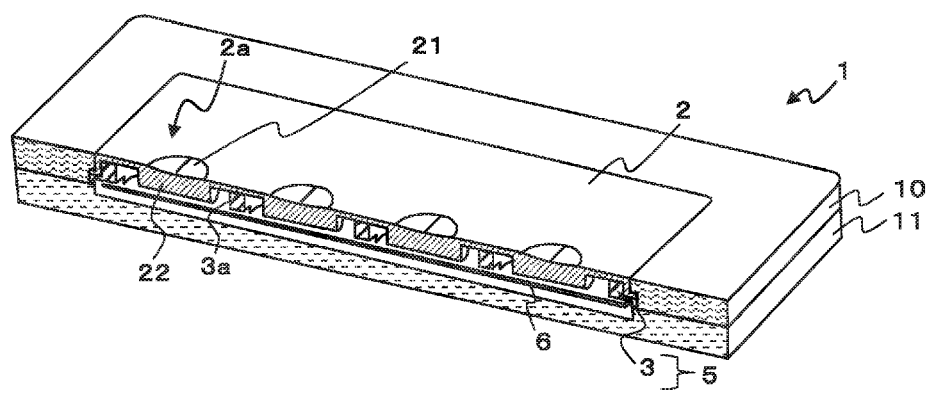
FIGS. 8A and 8B are a cross-sectional perspective view and a cross-sectional view of a switch apparatus according to a second embodiment of the present invention.
Figure 8B:
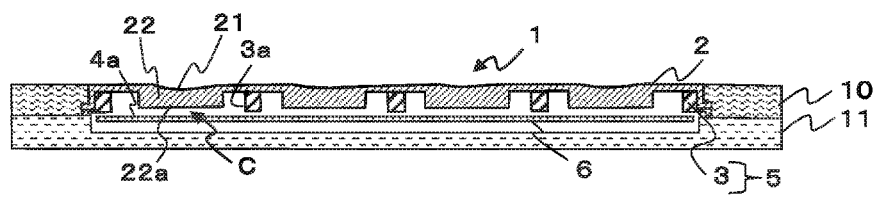
Figure 9A:
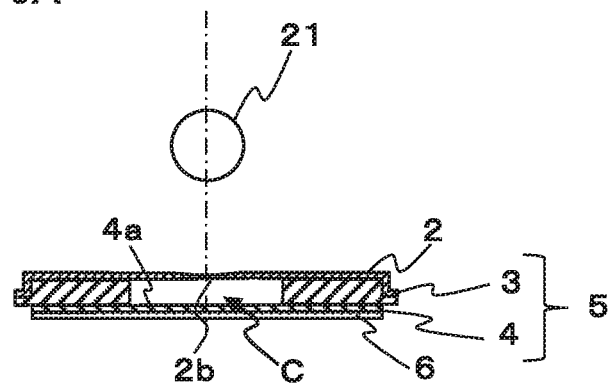
FIGS. 9A-9F are cross-sectional views of respective switch apparatuses according to third to eighth embodiments of the present invention.
Figure 9B:
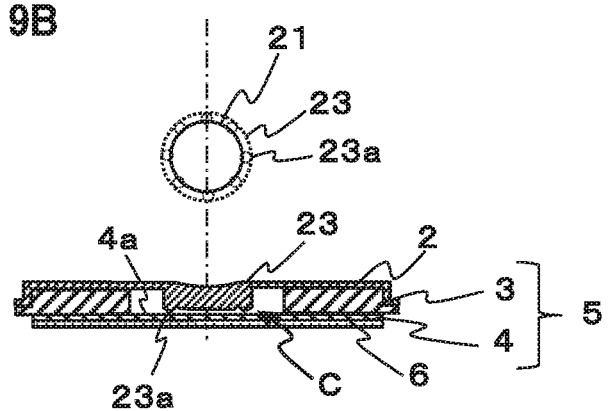
Figure 9C:
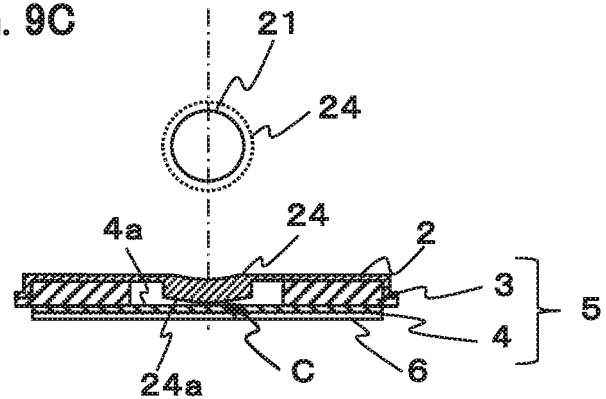
Figure 9D:
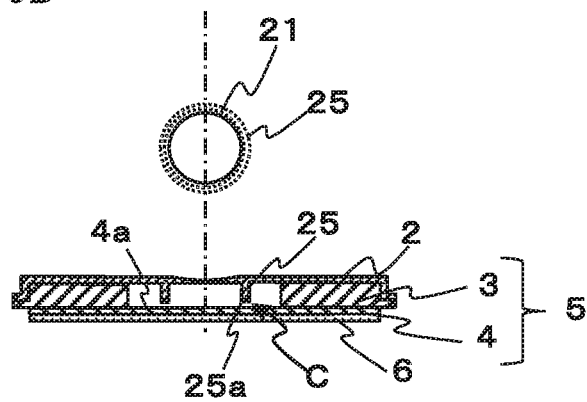
Figure 9E:
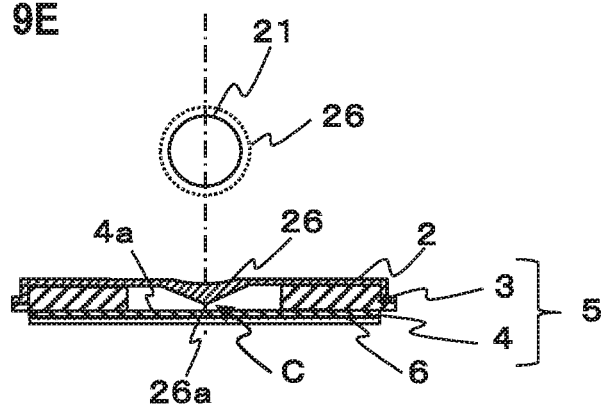
Figure 9F:
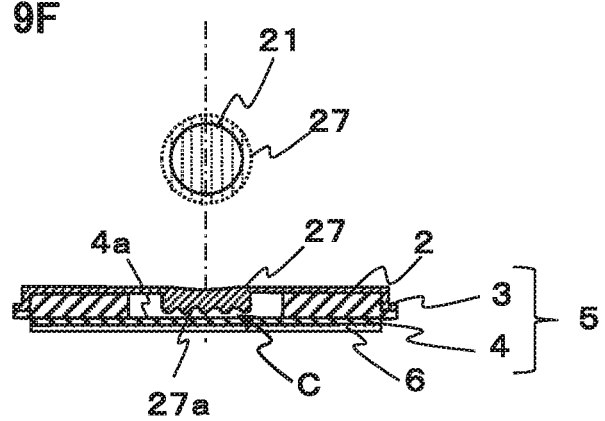

FIG. 8 is a cross-sectional perspective view and a cross-sectional view of the switch apparatus according to the second embodiment of the present invention. FIG. (8A) is a cross-sectional perspective view of the switch apparatus according to the second embodiment taken along a line corresponding to the line X-X in FIG. (1B). FIG. (8B) is a cross-sectional view of the switch apparatus according to the second embodiment taken along a line corresponding to the line X-X in FIG. (1B).

The switch apparatus 1 according to the second embodiment does not include the base housing 4 in the housing 5, and the electrostatic capacitance sensor 6 is fixed to the upper housing 3.

The electrostatic capacitance sensor 6 is fixed to the bottom of the upper housing 3. As illustrated in FIG. (8A) and FIG. (8B), in the present embodiment, the electrostatic capacitance sensor 6 is a member disposed just near the pressing region 2a of the pressing section 2 in the pressing direction.

As illustrated in FIG. (8B), the clearance C is provided between the lowermost surface 22a of the protrusion 22 of the pressing section 2 and an upper surface 6a of the electrostatic capacitance sensor 6. A predetermined distance or more is secured as the clearance C in the pressing direction when the pressing operation is not performed on the pressing region 2a of the pressing section 2. The distance of the clearance C in the pressing direction may be, for example, 0.3 mm or more, and more preferably 0.5 mm or more. When the pressing operation is performed on the pressing region 2a of the pressing section 2, the lowermost surface 22a of the protrusion 22 is first brought into contact with the upper surface 6a of the electrostatic capacitance sensor 6. When the pressing operation is further performed, the protrusion 22 deforms. As mentioned above, the clearance C is secured between the lowermost surface 22a of the protrusion 22 of the pressing section 2 and the upper surface 6a of the electrostatic capacitance sensor 6. Thus, when the pressing region 2a of the pressing section 2 is pressed down, the vicinity of the pressing region 2a of the pressing section 2 is relatively easily deflected. This allows a finger of the operator or the like that has pressed the pressing region 2a to relatively easily move in the pressing direction. Thus, the operator can easily and surely realize that the operator operates the switch apparatus. Since the configuration does not include the base housing 4, it is possible to achieve weight reduction and thickness reduction, as compared with the switch apparatus according to the first embodiment.

Third to Eighth Embodiments

Next, respective switch apparatuses according to third to eighth embodiments of the present invention are described. In the present embodiments, components common to those in the first embodiment are denoted by the same reference numerals, and description thereof is appropriately omitted.

FIG. 9 is cross-sectional views of the respective switch apparatuses according to the third to eighth embodiments of the present invention. Note that, in FIG. 9, the upper case 10 and the lower case 11 are omitted in illustration. FIG. (9A) is a cross-sectional view of the switch apparatus according to the third embodiment taken along a line corresponding to the line Y-Y in FIG. (1B) and a partial top view thereof. FIG. (9B) is a cross-sectional view of the switch apparatus according to the fourth embodiment taken along a line corresponding to the line Y-Y in FIG. (1B) and a partial top view thereof. FIG. (9C) is a cross-sectional view of the switch apparatus according to the fifth embodiment taken along a line corresponding to the line Y-Y in FIG. (1B) and a partial top view thereof. FIG. (9D) is a cross-sectional view of the switch apparatus according to the sixth embodiment taken along a line corresponding to the line Y-Y in FIG. (1B) and a partial top view thereof. FIG. (9E) is a cross-sectional view of the switch apparatus according to the seventh embodiment taken along a line corresponding to the line Y-Y in FIG. (1B) and a partial top view thereof. FIG. (9F) is a cross-sectional view of the switch apparatus according to the eighth embodiment taken along a line corresponding to the line Y-Y in FIG. (1B) and a partial top view thereof.

As illustrated in FIG. (9A), the switch apparatus 1 according to the third embodiment does not include the protrusion 22 of the pressing section 2 in the switch apparatus 1 according to the first embodiment.

In the switch apparatus 1, the clearance C is provided between a lowermost surface 2b of the pressing section 2 and the upper surface 4a of the base housing 4. A predetermined distance or more is secured as the clearance C in the pressing direction when the pressing operation is not performed on the pressing region 2a of the pressing section 2. When the pressing operation is performed on the pressing region 2a of the pressing section 2, the pressing section 2 is deflected. When an amount of the pressing operation is increased, the lowermost surface 2b of the pressing section 2 is brought into contact with the upper surface 4a of the base housing 4. When the pressing operation is further performed, the pressing section 2 deforms. As mentioned above, the clearance C is secured between the lowermost surface 2b of the pressing section 2 and the upper surface 4a of the base housing 4. Thus, when the pressing region 2a of the pressing section 2 is pressed down, the vicinity of the pressing region 2a of the pressing section 2 is relatively easily deflected. This allows a finger of the operator or the like that has pressed the pressing region 2a to relatively easily move in the pressing direction. Thus, the operator can easily and surely realize that the operator operates the switch apparatus.

As illustrated in FIG. (9B), the switch apparatus 1 according to the fourth embodiment includes a protrusion 23 in place of the protrusion 22 in the switch apparatus 1 according to the first embodiment.

The protrusion 23 is formed in a substantially columnar shape, and includes, at a front end of the bottom surface thereof, a plurality of small protrusions 23a. In the switch apparatus 1, the clearance C is provided between front ends of the small protrusions 23a of the protrusion 23 of the pressing section 2 and the upper surface 4a of the base housing 4. A predetermined distance is secured as the clearance C in the pressing direction when the pressing operation is not performed on the pressing region 2a of the pressing section 2. When the pressing operation is performed on the pressing region 2a of the pressing section 2, the small protrusions 23a of the protrusion 23 are first brought into contact with the upper surface 4a of the base housing 4. When the pressing operation is further performed, the small protrusions 23a of the protrusion 23 deform. As mentioned above, the clearance C is secured between the small protrusions 23a of the protrusion 23 of the pressing section 2 and the upper surface 4a of the base housing 4. Thus, when the pressing region 2a of the pressing section 2 is pressed down, the vicinity of the pressing region 2a of the pressing section 2 is relatively easily deflected. This allows a finger of the operator or the like that has pressed the pressing region 2a to relatively easily move in the pressing direction. Thus, the operator can easily and surely realize that the operator operates the switch apparatus. Also, when the pressing operation is further performed after the front ends of the small protrusions 23a of the protrusion 23 are brought into contact with the upper surface 4a of the base housing 4, the small protrusions 23a of the protrusion 23 easily deform with a certain degree of repulsive force, which allows the finger of the operator or the like to further move in the pressing direction. Therefore, the operator more effectively realizes the pressing operation. In particular, only the small protrusions 23a are in contact with the upper surface 4a of the base housing 4 immediately after the front ends of the small protrusions 23a of the protrusion 23 are brought into contact with the upper surface 4a of the base housing 4. This causes the small protrusions 23a to relatively easily deform.

As illustrated in FIG. (9C), the switch apparatus 1 according to the fifth embodiment includes a protrusion 24 in place of the protrusion 22 in the switch apparatus 1 according to the first embodiment.

The protrusion 24 is formed in a columnar shape that has a diameter larger than the diameter of the recess 21, and a lower end surface of the column is formed in a curved surface in which a substantial center part is located at a lowermost end. In the switch apparatus 1, the clearance C is provided between the lowermost point of the lowermost surface 24a of the protrusion 24 of the pressing section 2 and the upper surface 4a of the base housing 4. A predetermined distance or more is secured as the clearance C in the pressing direction when the pressing operation is not performed on the pressing region 2a of the pressing section 2. When the pressing operation is performed on the pressing region 2a of the pressing section 2, the lowermost point of the lowermost surface 24a of the protrusion 24 is first brought into contact with the upper surface 4a of the base housing 4. When the pressing operation is further performed, the protrusion 24 deforms. As mentioned above, the clearance C is secured between the lowermost point of the lowermost surface 24a of the protrusion 24 of the pressing section 2 and the upper surface 4a of the base housing 4. Thus, when the pressing region 2a of the pressing section 2 is pressed down, the vicinity of the pressing region 2a of the pressing section 2 is relatively easily deflected. This allows a finger of the operator or the like that has pressed the pressing region 2a to relatively easily move in the pressing direction. Thus, the operator can easily and surely realize that the operator operates the switch apparatus. Also, only a part of the lowermost surface 24a of the protrusion 24 is first in contact with the upper surface 4a of the base housing 4 after the lowermost point of the lowermost surface 24a of the protrusion 24 is brought into contact with the upper surface 4a of the base housing 4. This causes the protrusion 24 to relatively easily deform, and allows the finger of the operator or the like to further move in the pressing direction. Therefore, the operator more effectively realizes the pressing operation.

As illustrated in FIG. (9D), the switch apparatus 1 according to the sixth embodiment includes a protrusion 25 in place of the protrusion 22 in the switch apparatus 1 according to the first embodiment.

The protrusion 25 is formed in a cylindrical shape that has a diameter larger than that of the recess 21. In the switch apparatus 1, the clearance C is provided between a lowermost surface 25a of the protrusion 25 of the pressing section 2 and the upper surface 4a of the base housing 4. A predetermined distance or more is secured as the clearance C in the pressing direction when the pressing operation is not performed on the pressing region 2a of the pressing section 2. When the pressing operation is performed on the pressing region 2a of the pressing section 2, the lowermost surface 25a of the protrusion 25 is first brought into contact with the upper surface 4a of the base housing 4. When the pressing operation is further performed, the protrusion 25 deforms. As mentioned above, the clearance C is secured between the lowermost surface 25a of the protrusion 25 of the pressing section 2 and the upper surface 4a of the base housing 4. Thus, when the pressing region 2a of the pressing section 2 is pressed down, the vicinity of the pressing region 2a of the pressing section 2 is relatively easily deflected. This allows a finger of the operator or the like that has pressed the pressing region 2a to relatively easily move in the pressing direction. Thus, the operator can easily and surely realize that the operator operates the switch apparatus. When the pressing operation is further performed after the lowermost surface 25a of the protrusion 25 is brought into contact with the upper surface 4a of the base housing 4, the protrusion 25 easily deforms with a certain degree of repulsive force, which allows the finger of the operator or the like to further move in the pressing direction. Therefore, the operator more effectively realizes the pressing operation. In particular, since the protrusion 25 has a cylindrical shape in the present embodiment, the protrusion 25 easily deforms as compared with the columnar protrusion 22 if both protrusions are made of the same material.

As illustrated in FIG. (9E), the switch apparatus 1 according to the seventh embodiment includes a protrusion 26 in place of the protrusion 22 in the switch apparatus 1 according to the first embodiment.

The protrusion 26 is a conical member that includes, as a bottom surface, a circle having a diameter larger than that of the recess 21. In the switch apparatus 1, the clearance C is provided between a tip part 26a of the protrusion 26 of the pressing section 2 and the upper surface 4a of the base housing 4. A predetermined distance or more is secured as the clearance C in the pressing direction when the pressing operation is not performed on the pressing region 2a of the pressing section 2. When the pressing operation is performed on the pressing region 2a of the pressing section 2, the tip part 26a of the protrusion 26 is first brought into contact with the upper surface 4a of the base housing 4. When the pressing operation is further performed, the protrusion 26 deforms. As mentioned above, the clearance C is secured between the tip part 26a of the protrusion 26 of the pressing section 2 and the upper surface 4a of the base housing 4. Thus, when the pressing region 2a of the pressing section 2 is pressed down, the vicinity of the pressing region 2a of the pressing section 2 is relatively easily deflected. This allows a finger of the operator or the like that has pressed the pressing region 2a to relatively easily move in the pressing direction. Thus, the operator can easily and surely realize that the operator operates the switch apparatus. Also, when the pressing operation is further performed after the tip part 26a of the protrusion 26 is brought into contact with the upper surface 4a of the base housing 4, the protrusion 26 easily deforms with a certain degree of repulsive force, which allows the finger of the operator or the like to further move in the pressing direction. Therefore, the operator more effectively realizes the pressing operation. In particular, since the protrusion 26 has a conical shape in the present embodiment, the protrusion 26 easily deforms as compared with the columnar protrusion 22 if both protrusions are made of the same material.

As illustrated in FIG. (9F), the switch apparatus 1 according to the eighth embodiment includes a protrusion 27 in place of the protrusion 22 in the switch apparatus 1 according to the first embodiment.

The protrusion 27 is formed in a columnar shape having a diameter larger than that of the recess 21, and a lower end surface of the column is a waved surface 27a. In the switch apparatus 1, the clearance C is provided between a lowermost end of the waved surface 27a of the protrusion 27 of the pressing section 2 and the upper surface 4a of the base housing 4. A predetermined distance or more is secured as the clearance C in the pressing direction when the pressing operation is not performed on the pressing region 2a of the pressing section 2. When the pressing operation is performed on the pressing region 2a of the pressing section 2, the lowermost end of the waved surface 27a of the protrusion 27 is first brought into contact with the upper surface 4a of the base housing 4. When the pressing operation is further performed, the protrusion 27 deforms. As mentioned above, the clearance C is secured between the lowermost end of the waved surface 27a of the protrusion 27 of the pressing section 2 and the upper surface 4a of the base housing 4. Thus, when the pressing region 2a of the pressing section 2 is pressed down, the vicinity of the pressing region 2a of the pressing section 2 is relatively easily deflected. This allows a finger of the operator or the like that has pressed the pressing region 2a to relatively easily move in the pressing direction. Thus, the operator can easily and surely realize that the operator operates the switch apparatus. Also, only a part of the waved surface 27a of the protrusion 27 is first in contact with the upper surface 4a of the base housing 4 after the lowermost end of the waved surface 27a of the protrusion 27 is brought into contact with the upper surface 4a of the base housing 4. This causes the protrusion 27 to relatively easily deform and allows the finger of the operator or the like to further move in the pressing direction. Thus, the operator more effectively realizes the pressing operation.

Other Embodiments

Although the present invention is hereinbefore described based on some embodiments, the present invention is not limited to the above-described embodiments, and is applicable to other various modes.

For example, in the above-described first to eighth embodiments, character design, graphic design, coloring, and the like may be performed on the top surface of the pressing section 2. Also, another member that does not prevent deformation of the pressing section 2 may be bonded to the top surface of the pressing section 2.

Also, in the above-described first to eighth embodiments, a light source unit that applies light to the upper side may be provided under the electrostatic capacitance sensor 6. In this case, at least a part of the pressing section 2, the housing 5, and the electrostatic capacitance sensor 6 may be formed as a transparent or semitransparent member that allows the light to pass therethrough.

INDUSTRIAL APPLICABILITY

The present invention is utilized in a switch apparatus that detects operation performed on a pressing region in a pressing detection, and is applicable to, for example, an onboard switch apparatus.

The invention claimed is:

1. A switch apparatus comprising:
a housing that is configured with an upper housing and a base housing, the upper housing and the base housing facing each other, the upper housing including a plurality of recesses;
an elastic member that is made of an elastic material, the elastic member being attached to the housing, the elastic member having first and second surfaces opposite to each other, the elastic member having a plurality of protrusions on the first surface, the plurality of protrusions being laterally surrounded by the plurality of recesses;
a plurality of press-down regions that are provided in the elastic member, each of the plurality of press-down regions being configured to move downwardly when each of the plurality of press-down regions is pressed from above in a pressing direction, the plurality of press-down regions corresponding to the plurality of protrusions; and
an electrostatic capacitance sensor that is configured to detect static electricity, the static electricity being generated when any of the plurality of press-down regions is pressed from above in the pressing direction,
wherein a space is provided between a tip of each of the plurality of protrusions and the base housing, and
the plurality of protrusions and the electrostatic capacitance sensor are located on opposite sides of the base housing.

2. The switch apparatus of claim 1,
wherein the elastic member is fixed to the housing by an insert molding method.

3. The switch apparatus of claim 1,
wherein the upper housing is located directly adjacent to a bottom surface of each of the plurality of press-down regions in the pressing direction.
4. The switch apparatus of claim 1,
wherein a distance between the tip of each of the plurality of protrusion and the base housing, in the pressing direction is within a range of 0.3 mm or more and 2.2 mm or less.
5. The switch apparatus of claim 1,
wherein each of the plurality of press-down regions has a stepped part.
6. The switch apparatus of claim 1,
wherein the elastic member is a silicone rubber.
7. The switch apparatus of claim 1,
wherein the elastic member has a hardness of 25 or more and 70 or less that is measured by a type A durometer in accordance with a measurement method of JIS K 6253.
8. The switch apparatus of claim 7,
wherein the tip of each of the plurality of protrusions contacts a corresponding area of the base housing at a contact point, and
when each of the plurality of press-down regions is pressed from above, a displacement at the contact point is within a range of 0.5 mm or more and less than 1.8 mm, and a load at the contact point is 7 N or less.
9. The switch apparatus of claim 8,
wherein the displacement at the contact point is within a range of 0.8 mm or more and less than 1.5 mm.

* * * * *